United States Patent [19]

Chiu

[11] Patent Number: 6,005,775
[45] Date of Patent: Dec. 21, 1999

[54] CIRCUIT BOARD MOUNTING APPARATUS WITH INVERTED U-SHAPED MOUNTING ARMS FOR MOUNTING A CIRCUIT BOARD

[75] Inventor: Chi-Heng Chiu, Taoyuan, Taiwan

[73] Assignee: Acer Peripherals, Inc., Taoyuan, Taiwan

[21] Appl. No.: 08/679,596

[22] Filed: Jul. 16, 1996

[51] Int. Cl.$^6$ .............................. H05K 5/02; H05K 7/18
[52] U.S. Cl. ........................... 361/752; 361/754; 361/736
[58] Field of Search ..................... 361/728, 738, 361/752, 754, 756, 758, 730, 748, 736

[56] References Cited

U.S. PATENT DOCUMENTS 5,398,156  3/1995  Steffes et al. ..................... 361/759 X
5,452,184  9/1995  Scholder et al. ..................... 361/799

*Primary Examiner*—Leo P. Picard
*Assistant Examiner*—Jayprakash N. Gandhi
*Attorney, Agent, or Firm*—Winston Hsu; Keith Kline

[57] ABSTRACT

This invention relates to a circuit board mounting apparatus with inverted U-shaped mounting arms for mounting a circuit board. The circuit board mounting apparatus comprises a base for loading the circuit board above it, two front end latching mechanisms installed on the base for removably and horizontally latching the front end of the circuit board, a supporting mechanism installed on the base for supporting the approximately center portion of the circuit board upward, and at least one inverted U-shaped mounting arm installed on the base having one open end facing downward. The open end of the mounting arm comprises an engaging means for engaging the rear end of the circuit board to prevent it from moving upward.

7 Claims, 2 Drawing Sheets

CIRCUIT BOARD MOUNTING APPARATUS WITH INVERTED U-SHAPED MOUNTING ARMS FOR MOUNTING A CIRCUIT BOARD

BACKGROUND OF THE INVENTION

1. Field of the Invention

This invention relates to circuit board mounting apparatus, and more particularly, to a circuit board mounting apparatus with inverted U-shaped mounting arms for mounting a circuit board.

2. Description of the Prior Art

Many small electronic devices such as telephones, electronic clocks, answering machines, etc., usually use plastic hooks instead of screws for mounting circuit boards inside their plastic housings. Such design can reduce the number of parts used in such small electronic devices and also simplify their assembly processes. FIGS. 1 and 2. shows an example of such plastic hook design used by prior art electronic devices.

FIG. 1 is a perspective view of a circuit board mounting apparatus 2 of a prior art design, and FIG. 2 is a sectional view 1—1 of the circuit board mounting apparatus 2 shown in FIG. 1. FIGS. 1 and 2 show that apparatus 2 comprises a plastic base 4, two front end latching mechanisms 6 installed on the base 4 for horizontally latching the front end 10 of the circuit board 8 in a removable manner, two supporting mechanisms 12 installed on the base 4 which are attached to the bottom side 14 of the circuit board 8 for supporting the circuit board 8 upward, and two rear end latching mechanisms 16 installed on the base 4 for horizontally latching the rear end 18 of the circuit board 8 in a removable manner.

Each of the front end latching mechanisms 6 is a plastic stud which comprises a recess 20 on its upper end. The front end 10 of the circuit board 8 is horizontally and removably engaged in the recesses 20 of the two plastic studs 6. Each of the two supporting mechanisms 12 comprises a positioning stud 22 on its upper end and the circuit board 8 comprises two corresponding positioning holes 24 wherein the two positioning studs 22 are engaged upward in the two positioning holes 24 when the circuit board 8 is mounted on the base 4. The two rear end latching mechanisms 16 are two vertical plastic studs and each of them comprises an inverted L-shaped hook 26 on its upper end for horizontally latching the rear end 18 of the circuit board 8 to prevent it from moving upward. Each of the hooks 26 comprises a slope 28 on its front upper end for allowing the rear end 18 of the circuit board 8 to slide down.

When mounting the circuit board 8 to the base 4, the front end 10 of the circuit board 8 is horizontally inserted into the two recesses 20 of the two front end latching mechanisms 6, and then the rear end 18 of the circuit board 8 is pressed down against the slopes 28 of the two rear end latching mechanisms 16 so that the positioning holes 24 and the rear end 18 of the circuit board 8 can engage with the positioning studs 22 of the two supporting mechanisms 12 and the two hooks 26 of the rear end latching mechanisms 16 separately.

One problem is experienced in using the two rear end latching mechanisms 16. These two vertical studs 16 are usually fairly short in order to keep the circuit board 8 close to the base 4. When removing the rear end 18 of the circuit board 8 from the base 4, the bending force exerted on top of each vertical stud 16 is almost completely transmitted to the connecting part between each stud 16 and the base 4 which frequently breaks the two studs 16. Such problem causes a lot of inconvenience when maintaining a small electronic device which uses such latching mechanism design.

SUMMARY OF THE INVENTION

It is therefore the goal of the present invention, by overcoming the limits of the prior art, to devise a new circuit board mounting apparatus to solve the above mentioned problem. Briefly, in a preferred embodiment, the present invention includes a circuit board mounting apparatus for horizontally mounting a substantially rectangular circuit board which comprises a front end and a rear end, said apparatus comprising:

(1) a base for loading the circuit board above it;

(2) at least one front end latching mechanism installed on the base for removably and horizontally latching the front end of the circuit board;

(3) at least one supporting mechanism installed on the base for supporting the approximately center portion of the circuit board upward; and (4) at least one inverted U-shaped mounting arm installed on the base having one open end facing downward, said open end of the mounting arm comprising an engaging means for engaging the rear end of the circuit board to prevent it from moving upward.

It is an advantage of the present invention that since a lot of the bending force exerted on top of the mounting arm is absorbed by the U-shaped structure of the mounting arm, the force transmitted to the connecting part between the mounting arm and the base 4 is substantially reduced which prevents the mounting arm from breaking when removing the rear end of the circuit board from the base.

These and other objects and the advantages of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
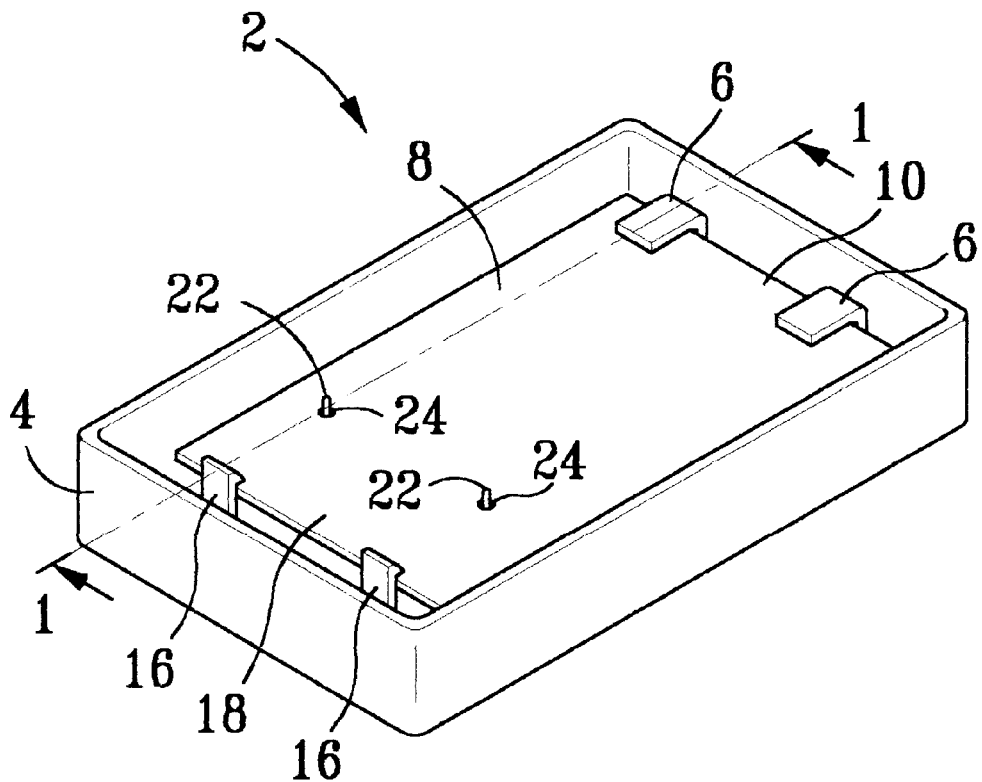
FIG. 1 is a perspective view of a circuit board mounting apparatus of a prior art design.
Figure 2:
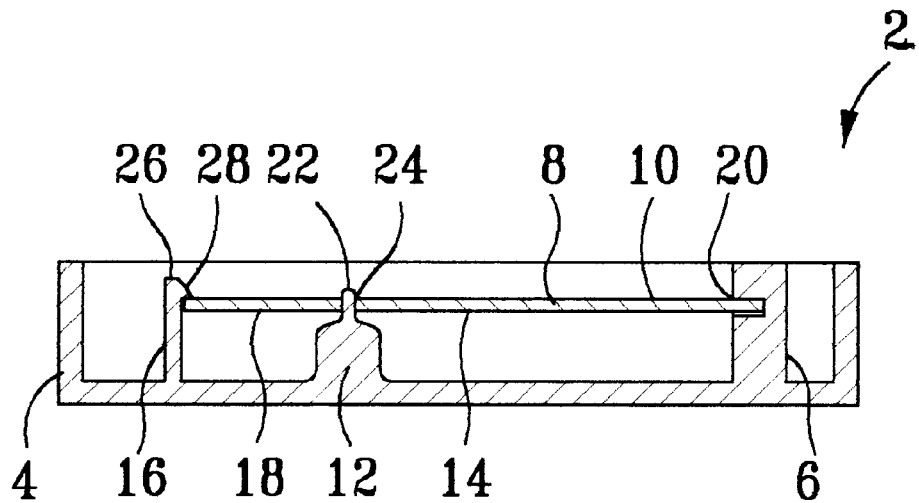
FIG. 2 is a sectional view 1—1 of the circuit board mounting apparatus shown in FIG. 1.
Figure 3:
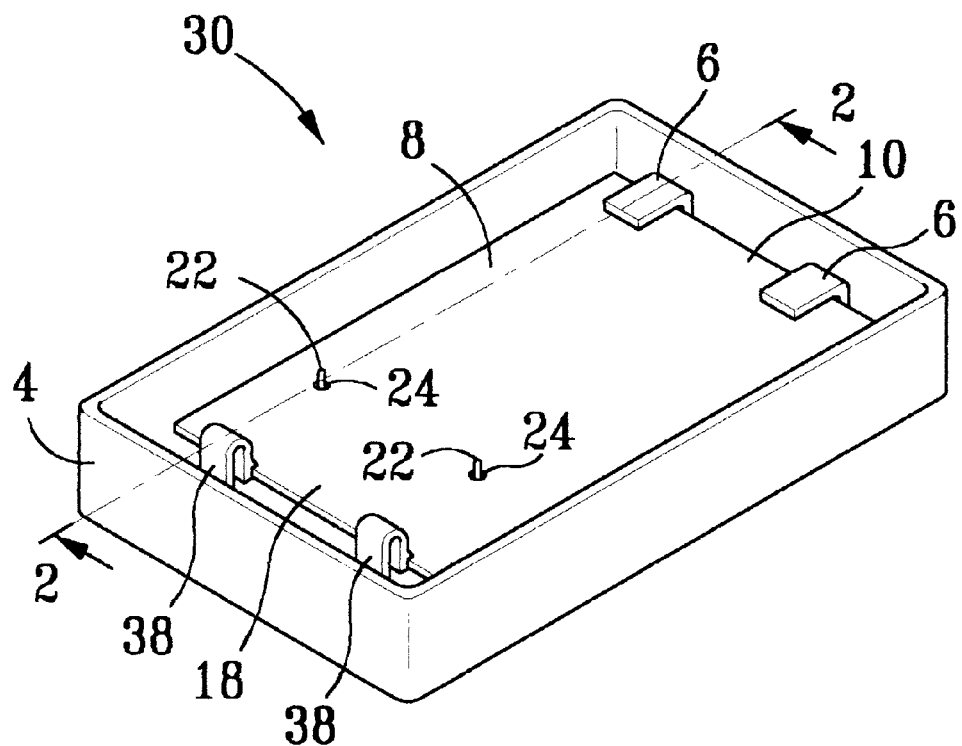
FIG. 3 is a perspective view of a circuit board mounting apparatus according to the present invention.
Figure 4:
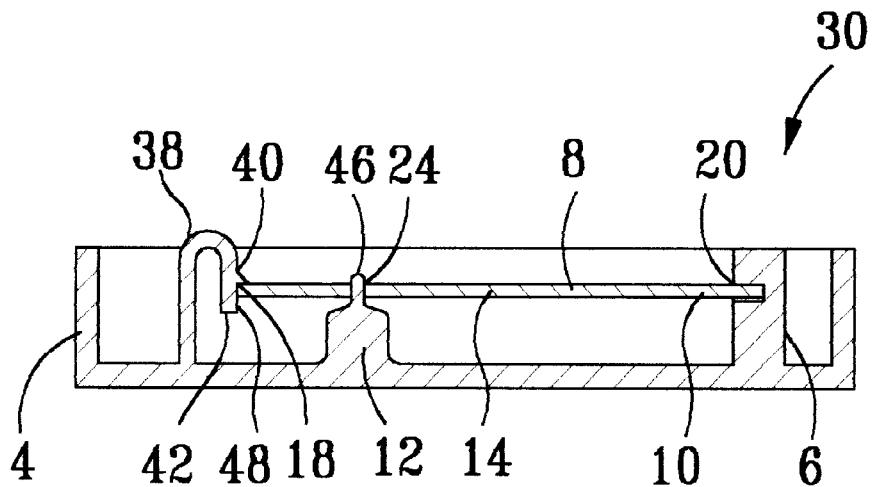
FIG. 4 is a sectional view 2—2 of the circuit board mounting apparatus shown in FIG. 3.

Please refer to FIGS. 3 and 4. FIG. 3 is a perspective view of a circuit board mounting apparatus 30 according to the present invention and FIG. 4 is a sectional view 2—2 of the circuit board mounting apparatus 30 shown in FIG. 3. FIGS. 3 and 4 show that the circuit board mounting apparatus 30 comprises a base 4 for loading the circuit board 8 above it, two front end latching mechanisms which are two vertical studs 6 installed on the base 4 for removably and horizontally latching the front end 10 of the circuit board 8, two supporting mechanisms 12 installed on the base 4 for supporting the approximately center portion of the circuit board 8 upward, and two inverted U-shaped mounting arms 38 installed on the base 4 for horizontally engaging the rear end 18 of the circuit board 8 to prevent it from moving upward.

Each of the two vertical studs 6 comprises a recess 20 installed on its top for horizontally engaging the front end 10 of the circuit board 8 and the front end 10 of the circuit board 8 is removably engaged in the recesses 20 of the two studs 6 horizontally. Each of the two supporting mechanisms 12 comprises a positioning stud 22 on its upper end for supporting the circuit board 8 and the circuit board 8 comprises two correspondent positioning holes 22 for engaging the two positioning studs 22 wherein the positioning studs 22 of the supporting mechanisms 12 are engaged upward in the positioning holes 24 of the circuit board 8. Both the mounting arms 38 and the base 4 are made by plastic material and the two mounting arms are integrally built on the base 4. Each of the two mounting arms 38 comprises one open end 42 facing downward with an engaging means which is an inverted L-shaped recess 48 for removably engaging the rear end 18 of the circuit board 8 to prevent it from moving upward. Each of the mounting arms 38 further comprises a slope 40 on its front upper end for allowing the rear end 18 of the circuit board 8 to slide down.

When mounting the circuit board 8 to the base 4, the front end 10 of the circuit board 8 is horizontally inserted into the two recesses 20 of the two front end latching mechanisms 6, and then the rear end 18 of the circuit board 8 is pressed down against the slopes 40 of the two mounting arms 38 so that the positioning holes 24 and the rear end 18 of the circuit board 8 can engage with the positioning studs 22 of the two supporting mechanisms 12 and the L-shaped recesses 48 of the two mounting arms 38 separately.

When removing the rear end 18 of the circuit board 8 out of the two mounting arms, the open end 42 of each mounting arm 38 will be depressed in order to release the rear end 18 of the circuit board 8 from the recess 48. A lot of the bending force exerted on top of each mounting arm 38 is absorbed by the U-shaped structure of each mounting arm 38 and the force transmitted to the connecting part between each mounting arm 38 and the base 4 is substantially reduced. Such U-shaped structure can thus prevent the mounting arms 38 from breaking when removing the rear end 18 of the circuit board 8 from the base 4.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A circuit board mounting apparatus for horizontally mounting a substantially rectangular circuit board which comprises a front end and a rear end, said apparatus comprising:

(1) a base for loading the circuit board above it;
(2) at least one front end latching mechanism installed on the base for removably and horizontally latching the front end of the circuit board;
(3) at least one supporting mechanism installed on the base for supporting the approximately center portion of the circuit board upward; and
(4) at least one inverted U-shaped mounting arm installed on the base having one open end facing downward, said open end of the mounting arm comprising an engaging means for engaging the rear end of the circuit board to prevent it from moving upward;

wherein the open end of said U-shaped mounting arm can be depressed to release the engaging means from the rear end of the circuit board when the rear end of the circuit board is mounted under the open end of the U-shaped mounting arm and the U-shaped mounting arm is used to absorb bending force transmitted to the connecting part between the U-shaped mounting arm and the base is substantially reduced.

2. The circuit board mounting apparatus of claim 1 wherein the mounting arm is made by plastic material.

3. The circuit board mounting apparatus of claim 2 wherein the mounting arm is integrally built on the base.

4. The circuit board mounting apparatus of claim 1 wherein the engaging means of the mounting arm comprises an inverted L-shaped recess for removably engaging the rear end of the circuit board to prevent it from moving upward.

5. The circuit board mounting apparatus of claim 1 comprising two front end latching mechanisms wherein each of the front end latching mechanisms comprises a vertical stud with a recess installed on top of the stud for horizontally engaging the front end of the circuit board wherein the front end of the circuit board is removably engaged in the recesses of the two studs horizontally.

6. The circuit board mounting apparatus of claim 1 wherein the supporting mechanism comprises at least one positioning stud on its upper end and the circuit board comprises at least one correspondent positioning hole for engaging the positioning stud wherein the positioning stud of the supporting mechanism is engaged upward in the positioning hole of the circuit board.

7. The circuit board mounting apparatus of claim 1 comprising two inverted U-shaped mounting arms for horizontally engaging the rear end of the circuit board to prevent it from moving upward.

* * * * *